United States Patent [19]

Heller et al.

[11] 4,039,861

[45] Aug. 2, 1977

[54] CROSS-COUPLED CHARGE TRANSFER SENSE AMPLIFIER CIRCUITS

[75] Inventors: Lawrence Griffith Heller, Brewster; Dominic Patrick Spampinato, Ozone Park, both of N.Y.

[73] Assignee: International Business Machines Corporation, Armonk, N.Y.

[21] Appl. No.: 656,677

[22] Filed: Feb. 9, 1976

[51] Int. Cl.² .................. H03K 5/20; H03K 5/18; G11C 11/40; H03K 3/353

[52] U.S. Cl. ................. 307/355; 307/238; 307/279; 307/DIG. 3; 307/DIG. 4; 340/173 CA

[58] Field of Search ............... 307/235 F, 235 T, 246, 307/279, 289, 238, 291, DIG. 3, DIG. 4; 340/173 R, 173 CA

[56] References Cited

U.S. PATENT DOCUMENTS

| | | | |
|---|---|---|---|
| 3,774,176 | 11/1973 | Stein et al. | 307/DIG. 3 X |
| 3,838,295 | 9/1974 | Lindell | 340/173 CA X |
| 3,882,326 | 5/1975 | Kruggel | 307/238 X |
| 3,949,381 | 4/1976 | Dennard et al. | 340/173 CA |

OTHER PUBLICATIONS

Furman et al, "Sense Latch Circuit for Memory Cells"; *IBM Tech. Discl. Bull.;* vol. 16, No. 9, pp. 2792–2793; Feb. 1974.

Spampinato, "Differential Sense Amplifier"; *IBM Tech. Discl. Bull.;* vol. 17, No. 6, pp. 1797–1798; Nov. 1974.

Jacobson et al, "Memory Bit Driver"; *IBM Tech. Discl. Bull.;* vol. 15, No. 6, pp. 1734–1735; Nov. 1972.

*Primary Examiner*—John S. Heyman
*Assistant Examiner*—Larry N. Anagnos
*Attorney, Agent, or Firm*—John J. Goodwin

[57] ABSTRACT

Sense amplifiers employing charge-transfer techniques and cross-coupled devices for use with memory cell arrays or as comparators, polarity sensors and differential amplifiers are described which include a unique preamplifier circuit having cross-coupled actuable devices and which provides a cross-coupled charge-transfer feature. The sense amplifier also includes actuable devices which provide further amplification. The preamplifier circuit includes two precharge actuable devices which have their gate electrode connected to the phase 1 line and which have their source electrode connected through separate capacitors to the phase 2 line. The terminals of the two preamplifier charge-transfer devices which are cross-coupled are also connected at the aforesaid circuit nodes and to the bit/sense lines and to the further amplification devices. The disclosure describes two embodiments of a preamplifier circuit, each of which is shown in combination with a plurality of different further amplification circuits.

10 Claims, 11 Drawing Figures

CROSS-COUPLED CHARGE TRANSFER SENSE AMPLIFIER CIRCUITS

BACKGROUND OF THE INVENTION

1. Field of the Invention

The present invention relates generally to sense amplifiers for memory systems or other small signal or analog circuits, and more particularly to a sense amplifier including a preamplifier circuit including cross-coupled charge transfer circuits.

2. Description of the Prior Art

In the recent past there have been several improvements in sensing circuits for memory cells, particularly the one device memory cell. One significant concept for improving the sensitivity of sensing circuits is the concept of charge transfer as described in U.S. Pat. No. 3,764,906, entitled "Stored Charge Detection by Charge Transfer", issued Oct. 10, 1973, to L. G. Heller and assigned to the International Business Machines Corporation. Other references related to this concept are U.S. Pat. No. 3,760,381, entitled "Stored Charge Memory Detection Circuit" issued Sept. 18, 1973, to Y. L. Yao and assigned to the International Business Machines Corporation; U.S. Pat. No. 3,789,312, entitled "Threshold Independent Linear Amplifier" issued Jan. 29, 1974 to L. G. Heller et al and assigned to the International Business Machines Corporation; U.S. Pat. No. 3,774,176, entitled "Semiconductor Memory Having Single Transistor Storage Elements and a Flip-Flop Circuit for the Evaluation and Regeneration of Information," issued Nov. 20, 1973 to K. U. Stein et al and assigned to Siemens Aktiengesellschaft; and U.S. patent application, Ser. No. 491,023, entitled "Differential Charge Transfer Sense Amplifier", filed July 23, 1974, by R. H. Dennard et al and assigned to the International Business Machines Corporation; and a paper entitled "High Sensitivity Charge-Transfer Sense Amplifier", 1975 IEEE International Solid-State Circuits Conference Digest, pp. 112-113, by L. G. Heller et al.

Another improvement in sensing circuits is the dynamic latch circuit and the threshold independent dynamic latch as described in U.S. patent application Ser. No. 591,983, entitled "Threshold Independent Latch", filed June 30, 1975, by D. P. Spampinato and assigned to the International Business Machines Corporation.

The present invention is a further improvement in the art of memory sensing circuits by embodying the novel concept of cross-coupled charge transfer to provide higher performance and greater sensitivity than is possible with the described prior art technology.

SUMMARY OF THE INVENTION

An object of the present invention is to provide an improved sense amplifier circuit for memory cell arrays or other small signal circuit applications.

Another object of the present invention is to provide an improved sense amplifier circuit for memory cell arrays incorporating cross-coupled charge transfer techniques.

Another object of the present invention is to use the regenerative capability of cross-coupled charge transfer techniques to provide both voltage gain and charge gain.

A further object of the present invention is to provide an improved sense amplifier circuit including a cross-coupled charge transfer preamplifier circuit and a further amplification circuit.

Still another object of the present invention is to provide an improved sense amplifier circuit for use with one device memory cells which produces high performance and increased sensitivity.

These and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
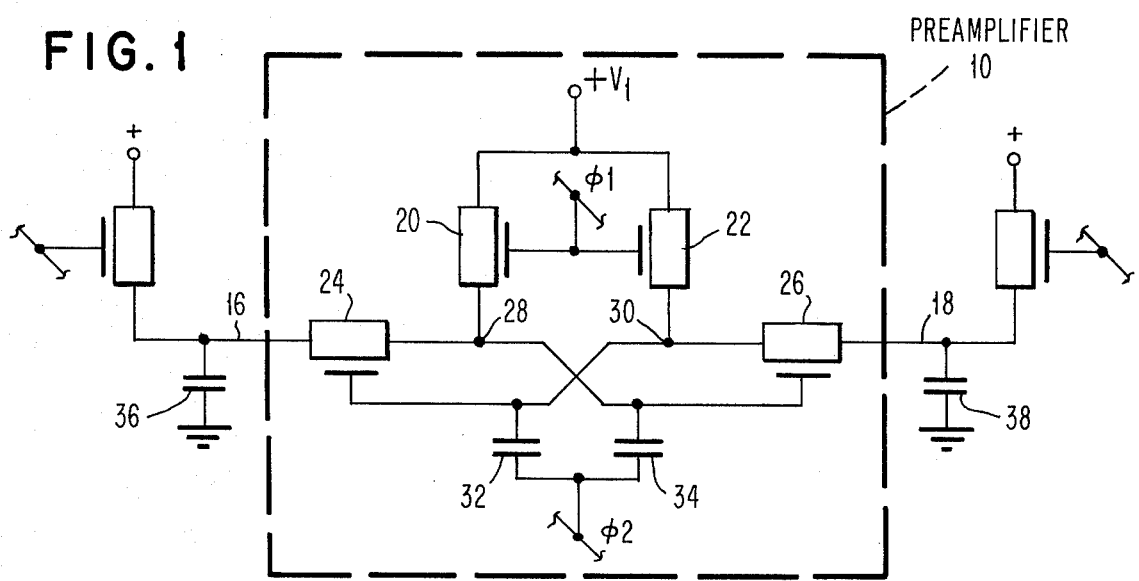
FIG. 1 is one embodiment of a cross-coupled charge transfer preamplifier circuit according to the principles of the present invention wherein the charge transfer means includes a cross-coupled pair of actuable devices.
Figure 2:
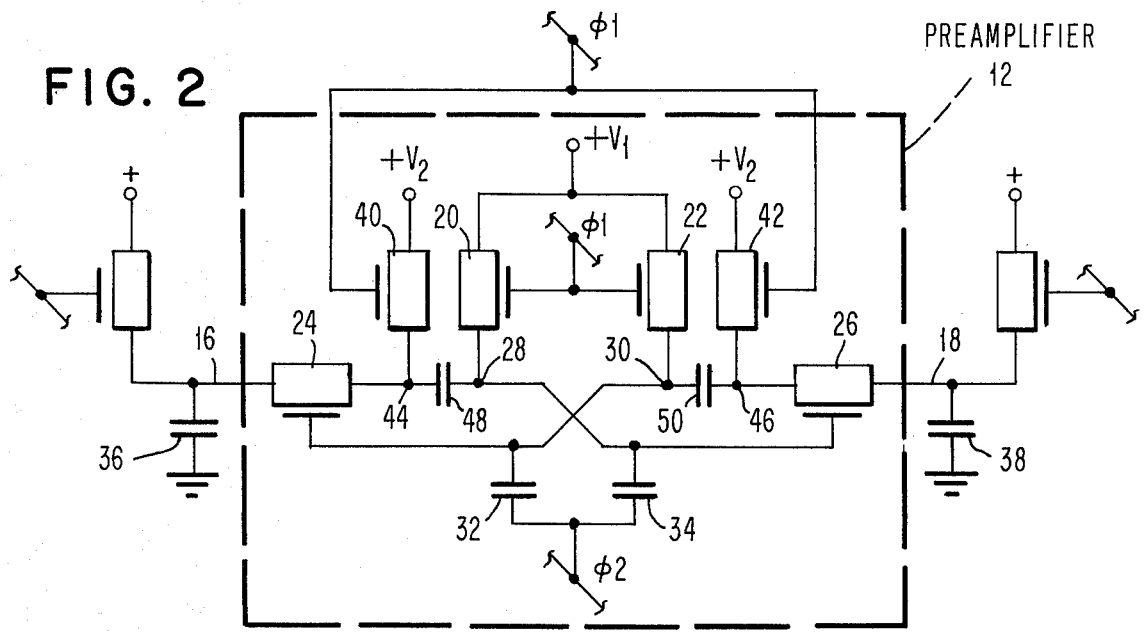
FIG. 2 is another embodiment of a cross-coupled transfer preamplifier circuit according to the principles of the present invention wherein the charge transfer means includes a cross-coupled pair of actuable devices.

Referring to FIG. 1, a first embodiment of a preamplifier circuit of the present invention is shown wherein the preamplifier circuit 10 includes cross-coupled charge transfer means and wherein the preamplifier circuit 10 is connected between bit/sense line (B/S) segments 16 and 18. Preamplifier circuit 10 includes two actuable devices 20 and 22 such as MOSFET's, the gate electrodes of which are connected to the phase 1 line. Preamplifier circuit 10 also includes actuable devices 24 and 26 such as MOSFET's wherein device 24 is connected to B/S line segment 16 and also to actuable device 20 at a circuit node 28. Device 26 is connected to B/S line segment 18 and also to actuable device 22 at a circuit node 30. The gate electrode of device 24 is cross-coupled to node 30 and also connected through capacitor 32 to the phase 2 line. The gate electrode of device 26 is cross-coupled to node 28 and also connected through capacitor 34 to the phase 2 line. Capacitors 36 and 38 represent parasitic capacitance which is inherent in the B/S lines. The parasitic capacitances are shown in FIGS. 1 and 2 for completeness, but are assumed but not shown in the figures for the remaining embodiments.

Figure 3:
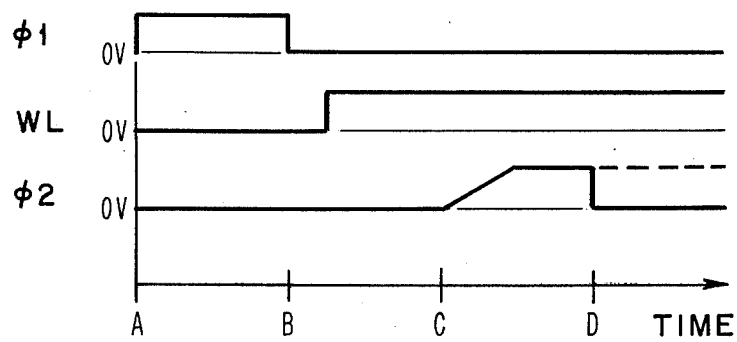
FIG. 3 is an illustration of a timing diagram showing the pulse sequence for the operation of the embodiment of FIGS. 1 and 2.

The preamplifier 10 of FIG. 1 will be described with reference to the pulsing sequence illustrated in the timing waveform of FIG. 3 wherein the period A-B is the precharge period, B-C is the period wherein the signal to be sensed is developed, and C-D is the charge transfer period. The actuable devices are assumed for purposes of explanation to be N-channel, enhancement type. Initially, the phase 1 line is activated, turning on devices 20 and 22 which are made to operate in the linear region. Thus, nodes 28 and 30 will charge to the power supply potential $V_1$ which is connected to devices 20 and 22. As nodes 28 and 30 charge up, cross-coupled charge transfer devices 24 and 26 will also turn on. Devices 24 and 26 operate in the saturation region and, therefore, the bit/sense line segments 16 and 18 are caused to charge up until they are at a predetermined cutoff value $V_1 - V_t$, where $V_t$ is the device threshold voltage and is a function of source to substrate voltage. The voltage $V_1$ is selected such that bit/sense line segments 16 and 18 are at a threshold potential midway between a worst case stored 1 and worst case stored 0 voltage level (in the case of the one device memory cell) where the 1 and 0 are high and low levels, respectively. Devices 24 and 26 then are at their cutoff state and the phase 1 line is now deactivated turning devices 20 and 22 off, thus ending the precharge period. If desired, it is also possible to perform an incomplete precharge, i.e., devices 20, 22 are turned off when charge-transfer devices 24, 26 are in a close-to-cutoff state. As a result, charge-transfer will take place between nodes 28, 30 and bit/sense lines 16, 18. Devices 24 and 26 will cutoff to a high degree since any charge transfer which takes place after devices 20 and 22 are turned off will cause the potential to drop on the gates of devices 24 and 26 (and nodes 28 and 30) thus forcing them to cutoff hard. It is also possible to enhance the gate-to-source capacitance of devices 20, 22 so that when the phase 1 line is deactiviated outcoupling takes place at nodes 28, 30 sufficient to turn charge-transfer devices 24, 26 off.

After the precharge period, a word line is accessed and, depending on the stored information, the sense signal will be either positive or negative, with the bit/sense lines charged to a midway potential. Assuming that a word line is accessed on the left side of the circuit and that the stored potential is zero volts, a negative signal is, therefore, developed on the bit/sense line capacitance. Correspondingly, the source potential of device 24 drops to $V_{sense}$ and its threshold voltage also decreases an incremental amount due to the backgate bias effect. The additive combination of the sense signal and the incremental threshold voltage decrease serve to give device 24 a higher gate drive ($V_{gate} - V_{sense} - V_{threshold}$) than device 26.

After the sense signal is introduced, the phase 2 line is ramped positive causing the potential on nodes 28 and 30 to momentarily increase. A point will be reached where device 24 will turn on initially by an amount to cause significant positive charge to transfer from node 28 to the bit/sense line 16. The bit/sense line capacitance is much larger than the capacitance at node 28. Therefore, the potential at node 28 will decrease rather than increase due to the voltage gain derived from the charge transfer process, thereby turning device 26 off. As the phase 2 ramp continues to rise positively the potential at node 30 rises while the potential at node 28 falls until device 24 is taken out of saturation and driven into the linear region at which point charge transfer ceases. Little or no charge was transferred from node 30 bit/sense line 18, therefore, node 30 experiences only a voltage rise. Essentially then, a preamplified signal is developed across nodes 28 and 30, which is at least equal to a device threshold voltage and independent of the magnitude of the sense signal (assumed small in comparison). Therefore, the preamplifier circuit provides a unique feature of charge gain, i.e., the preamplified signal across nodes 28 and 30 may contain more charge than was stored in the memory cell storage capacitor. At this point the preamplification phase is completed. This dashed line in the phase 2 waveform indicates that phase 2 turnoff time is noncritical. The same notation will be used in later embodiments.

If a 1 were stored in the memory cell, a positive signal would have been introduced onto the left bit/sense line. The previously described circuit operation is the same except that charge transfer would have taken place through device 26 and the preamplified signal at nodes 28 and 30 would have been of opposite polarity.

The aforesaid positive ramping of the phase 2 line to cause the potential on nodes 28 or 30 to increase via capacitors 32 or 34 serves the desired function of increasing the gate drive of device 24 or 26. It will be appreciated by one skilled in the art that the function of increasing the gate drive can be accomplished in other, substantially equivalent ways. For example, one alternative or equivalent technique would be to pull down the bit/sense line segments 16 or 18 by tieing capacitors 32 and 34 to bit/sense line segments 16 and 18 and negatively ramping the phase 2 line. Capacitors 32 and 34 may be tied directly to bit/sense line segments 16 and 18, or via transistor switches.

The preamplifier circuit 12 to FIG. 2 operates in much the same manner as the preamplifier circuit 10 of FIG. 1. The operation of circuit is as follows. The $\phi 1$ line is activated turning on devices 20, 22, 40 and 42. Since these devices are made to operate in the linear region nodes 28, 30 charge to $+V_1$ volts and nodes 44, 46 charge to $+V_2$ volts. As nodes 28 and 30 charge up, cross-coupled charge-transfer devices 24 and 26 will also turn on. Devices 24 and 26 operate in the saturation region and, therefore, the bit/sense line segments 16 and 18 are caused to charge up until they are at a predetermined cutoff value $V_1 - V_t$. Nodes 44 and 46 charge to $+V_2$ volts, where $V_2$ is larger than $V_1$. With devices 24 and 26 at their cutoff state the phase 1 is deactivated turning devices 20, 22, 40 and 42 off, thus ending the precharge period.

After the precharge period, a word line is accessed. Assume a sense signal consisting of a negative drop in potential is developed on the left bit/sense line. As previously explained device 24 has a higher gate drive than device 26.

After the sense signal is introduced, the phase 2 line is ramped positive causing the potential on nodes 28 and 30 to momentarily increase. As previously explained a point will be reached where device 24 will turn on initially by an amount to cause significant positive charge to transfer from node 44 to the bit/sense line 16. The bit/sense line capacitance is much larger than the capacitance at node 44. Therefore, the potential at node 44 will decrease rather than increase due to the voltage gain derived from the charge-transfer function. Also as a result of coupling through capacitor 48, node 28 will also drop in potential turning device 26 off. As the phase 2 ramp continues to rise positively the potential at nodes 30 and 46 rises while the potential at nodes 28 and 44 falls until device 24 is taken out of saturation and driven into the linear region at which point charge-transfer ceases. Little or no charge was transferred from node 46 to bit/sense line 18, therefore nodes 30 and 46 experience only a voltage rise. A preamplified signal is developed across nodes 44 and 46 which can be much larger than a device threshold voltage. Again this is possible through feature of charge gain. At this point the preamplification phase is completed. The introduction of a positive signal on B/S line 16 results in a preamplified signal across nodes 44 and 46 of the opposite polarity.

Figure 4:
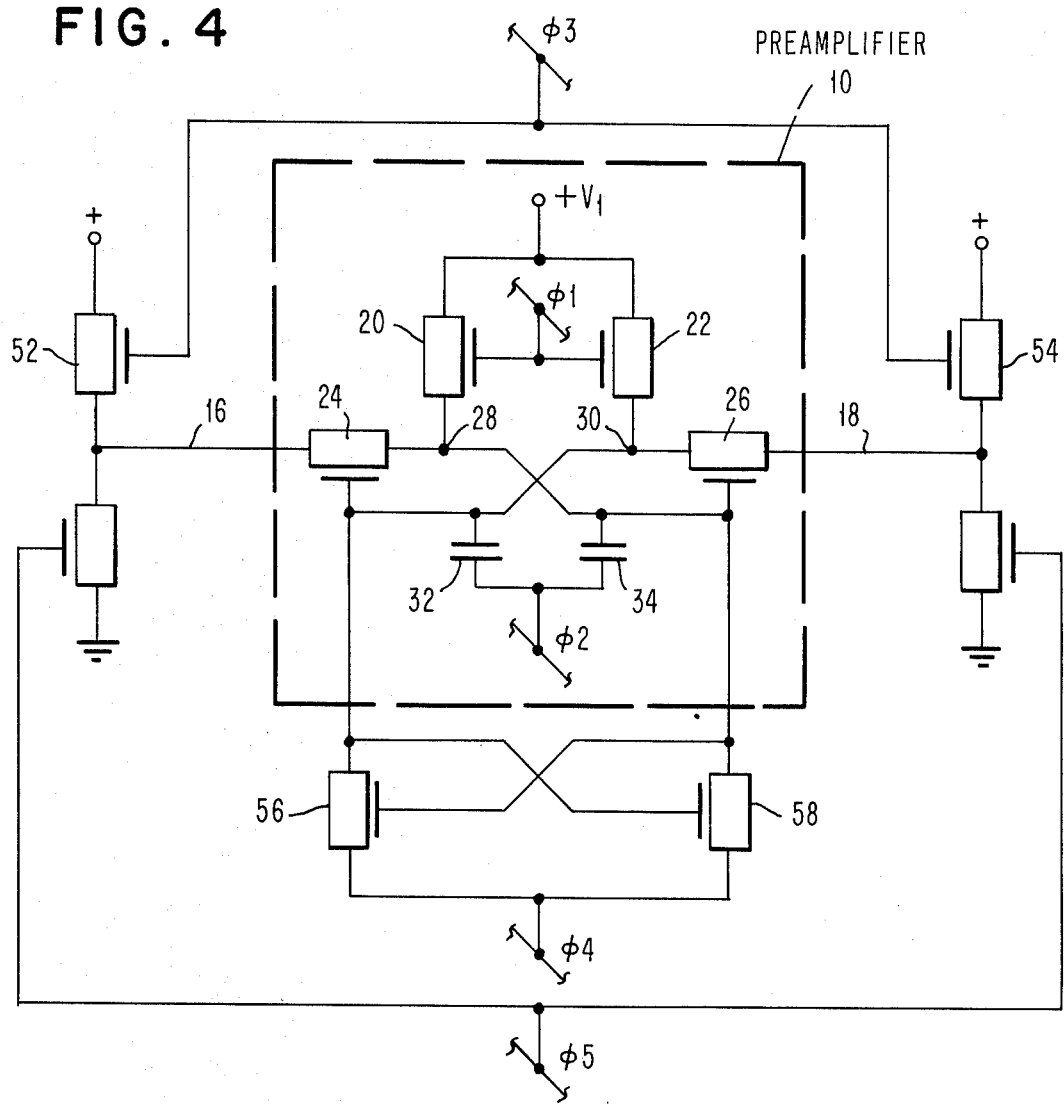
FIGS. 4, 6, 8, and 10 are further embodiments of cross-coupled charge transfer sensing circuits including cross-coupled charge transfer means in combination with different further amplifier means.
Figure 5:
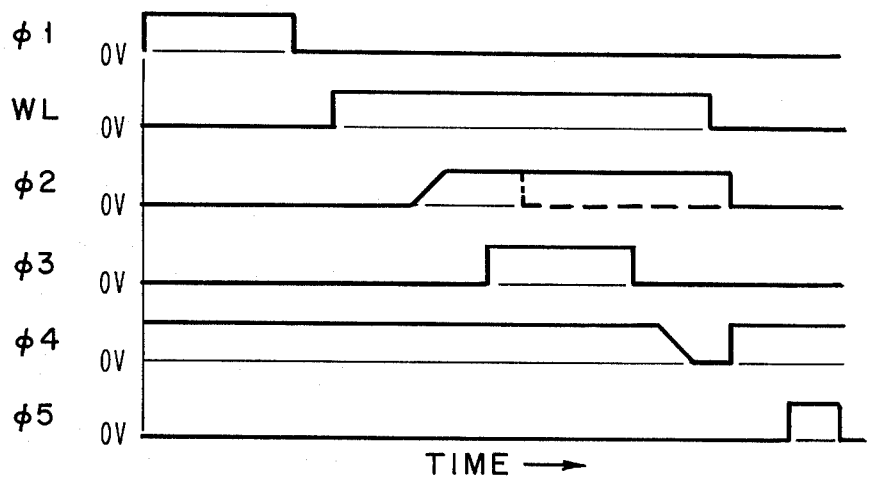
FIGS. 5, 7, 9, and 11 are illustrations of timing diagrams showing the pulsing sequences of each of the embodiments of the preceding figures.

A complete sense amplifier circuit which includes the preamplifier circuit 10 is shown in FIG. 4. The pulsing sequence is shown in FIG. 5. The preamplified signal appears across nodes 28 and 30 as previously described. Therefore, after preamplification, the φ3 line is activated turning devices 52, 54 on and charging the bit/sense lines to the stored 1 level. Devices 52, 54 are then turned off. The φ4 line is now ramped slowly toward ground potential. Since node 28 is lower in potential relative to node 30, assuming a negative sense signal is being sensed on the left-hand B/S line, device 58 will turn on before device 56. The ramp rate is such as to allow node 28 to follow φ4 within a threshold voltage of device 56. Device 56 then never turns on. As node 28 discharges device 24 turns on causing bit/sense line 16 to discharge. The bit/sense line is made to discharge down to ground potential. Since this was the original information in the memory cell its word line is deactivated; the information has been written back. The φ4 line is returned to $+V_1$ volts and the φ2 line is returned to 0 volts. The sense cycle is completed with the φ5 line activated discharging both bit/sense lines to ground potential. If a 1 had been sensed, devices 26 and 56 would turn on and B/S would stay high inserting the 1 level back into the memory cell.

Figure 6:
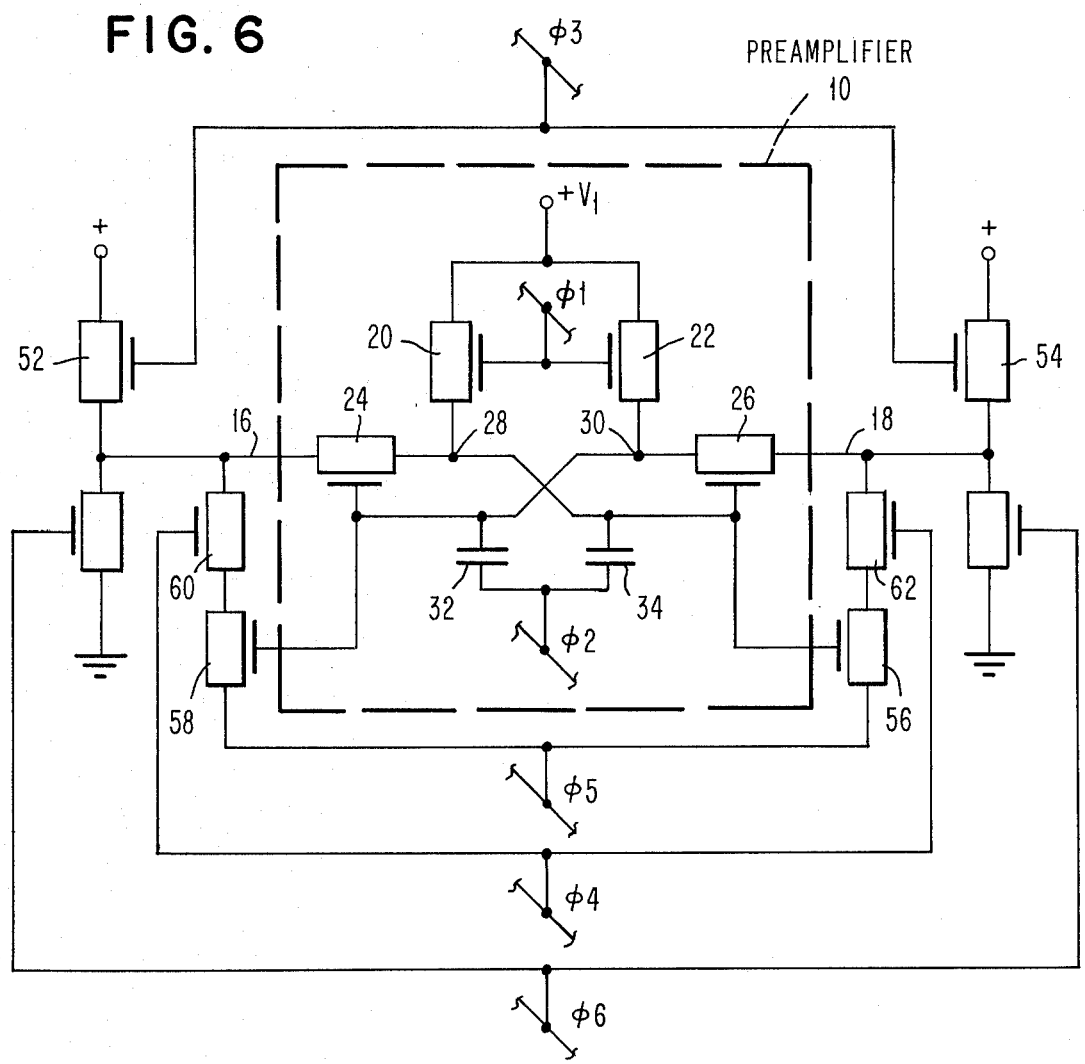
Figure 7:
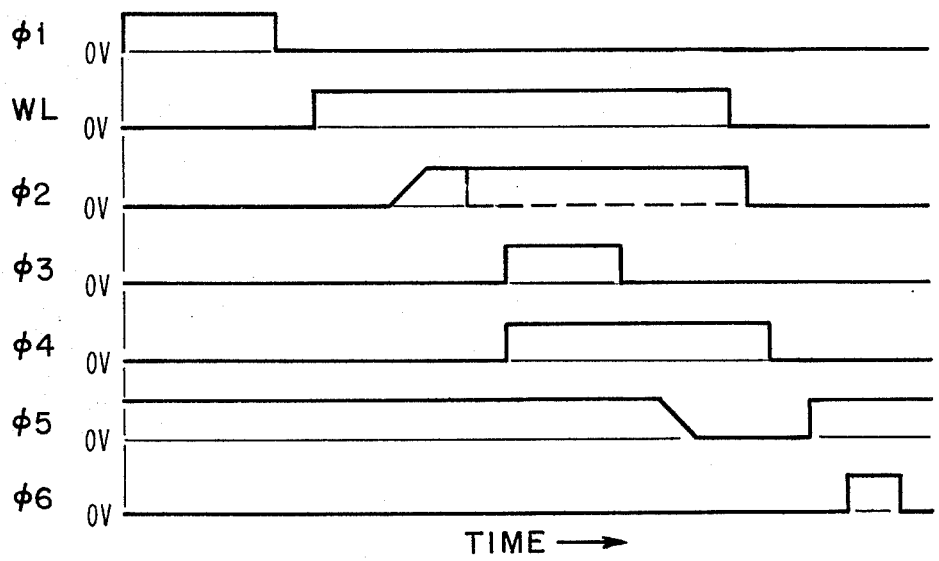

Another sense amplifier circuit which includes preamplifier circuit 10 is shown in FIG. 6. The associated pulsing sequence is shown in FIG. 7. The preamplified signal appears across nodes 28 and 30. The φ3 and φ4 lines are activated charging the bit/sense lines to the high level. The φ3 line is then deactivated. The φ5 line is ramped toward ground potential with the condition previously stated. Assuming a negative signal on B/S line 16, device 58 will turn on discharging bit/sense line 16 to ground potential. The word line is deactivated. The φ2 and φ4 lines are returned to 0 volts and the φ5 line is returned to $+V_1$ volts. φ6 is activated discharging both B/S lines to ground potential and the sense cycle is completed. The sensing of a 1 on B/S 16 results in B/S line 16 remaining high and a 1 being written back into the memory cell.

Figure 8:
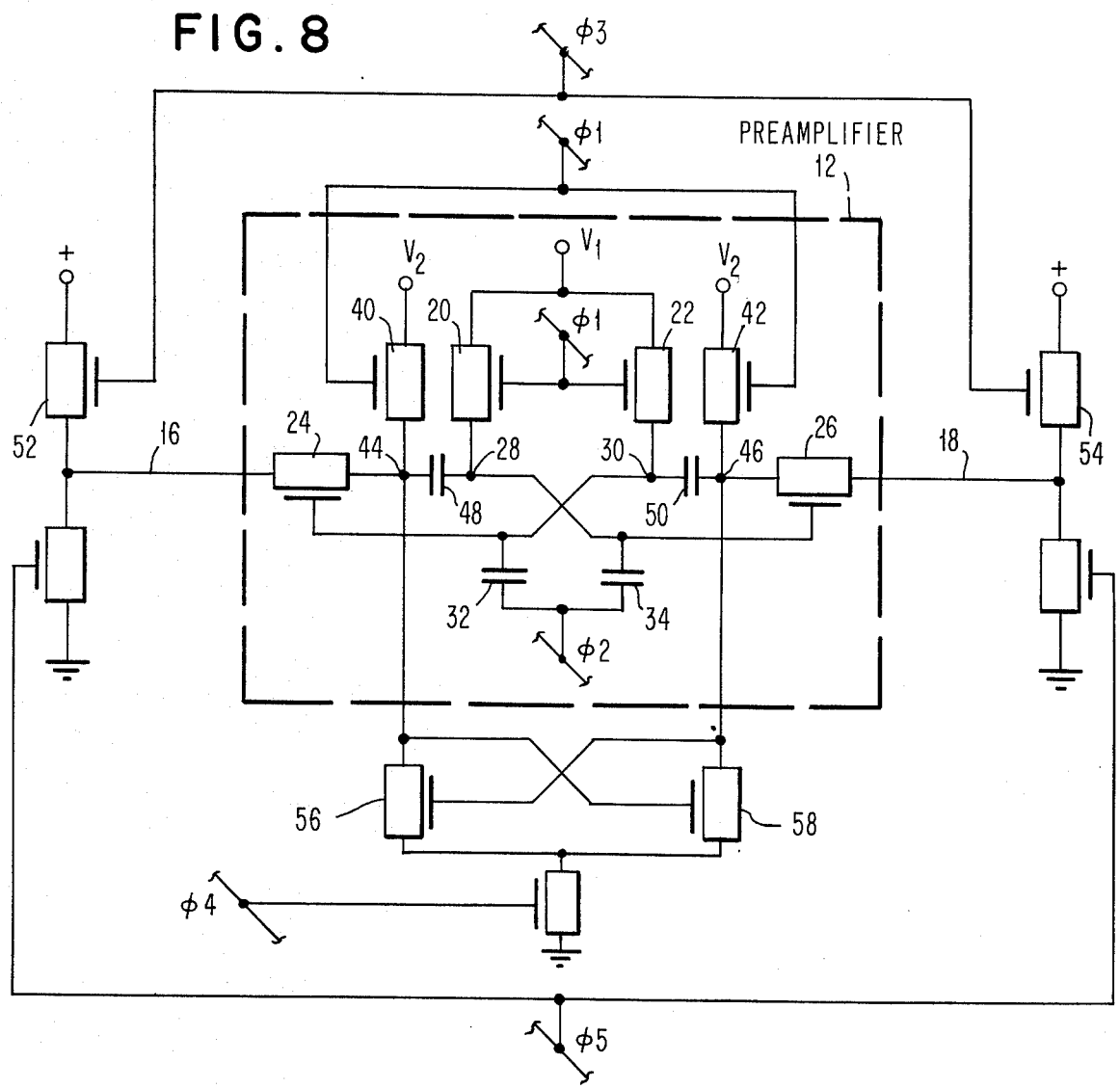
Figure 9:
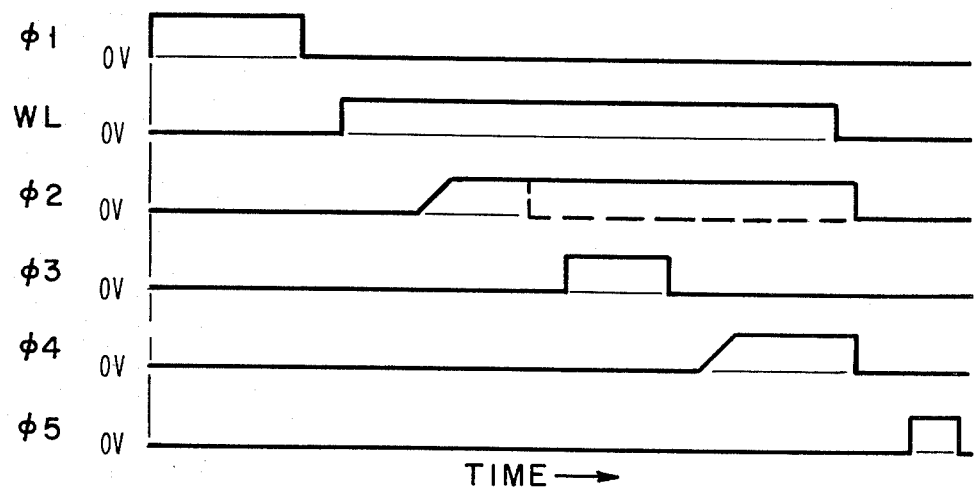

Another complete sense amplifier circuit is shown in FIG. 8. This embodiment is similar to that of FIG. 4 with preamplfiier 10 replaced by preamplifier 12. The associated timing diagrams shown in FIG. 9 are similar to FIG. 5.

Figure 10:
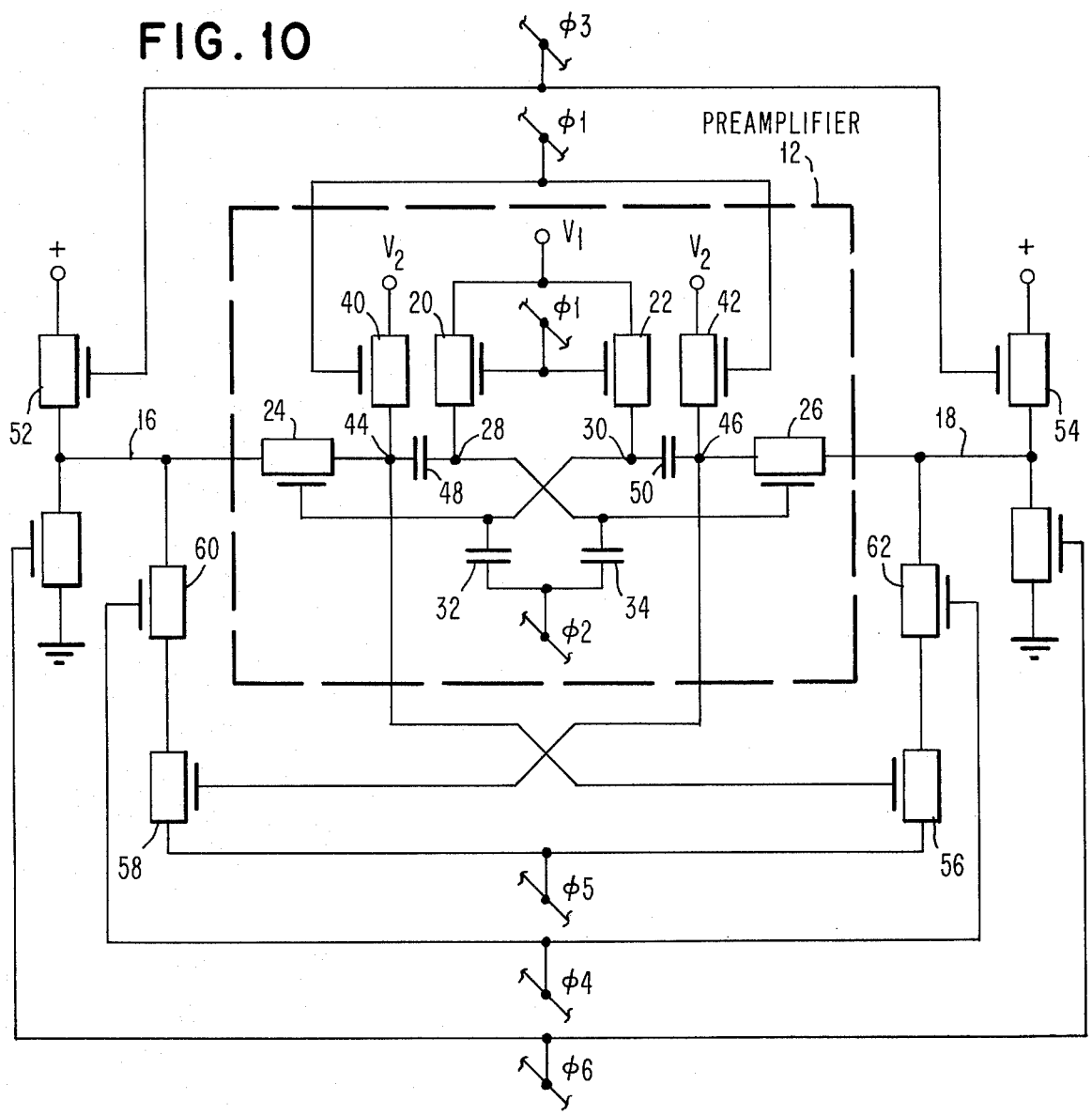
Figure 11:
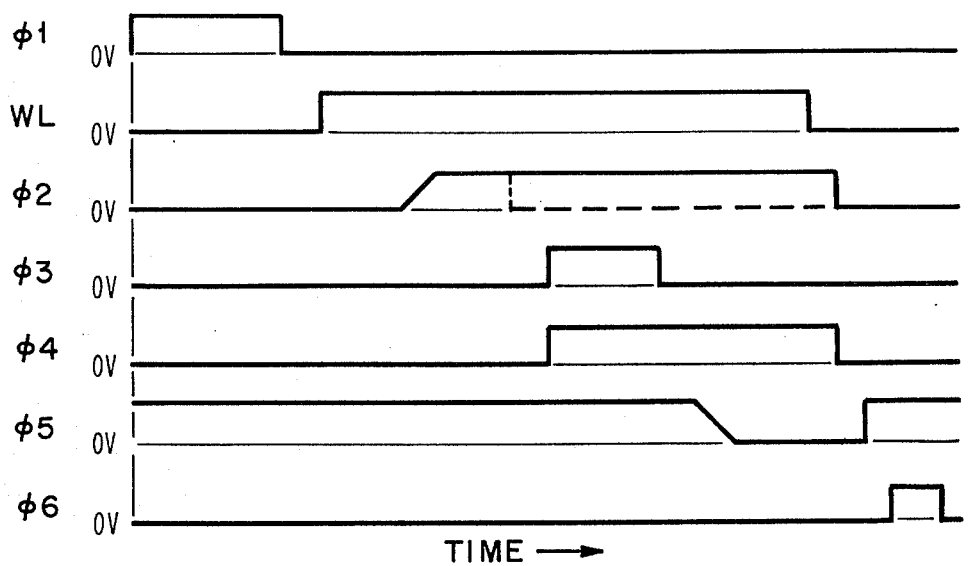

Similarly the embodiment of another complete sense amplifier circuit shown in FIG. 10 is similar to that shown in FIG. 6 with preamplifier 10 replaced with preamplifier 12. The associated timing diagrams shown in FIG. 11 are equivalent to FIG. 7.

What has been described has been unique preamplifiers and complete sense amplifiers which have been embodied in a memory cell array application. However, it should be evident to one skilled in art that the described circuits incorporating the novel cross-coupled charge transfer techniques to provide both voltage and charge gain can be generally used as signal sensors for sensing small signals in comparators, polarity sensors, and other small signal or analog circuit applications.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A preamplifier for signal detection comprising first and second charge-transfer actuable devices each having first and second current carrying electrodes and a control electrode, said first current carrying electrodes of said first and second actuable devices being coupled respectively to first and second sources of input signals to be detected, means for coupling said second electrode of said first actuable device to said control electrode of said second actuable device at a first node, means for coupling said second electrode of said second actuable device to said control electrode of said first actuable device at a second node, a first capacitor connected to said second electrode of said second actuable device at said second node and to said control electrode of said first actuable device, a second capacitor connected to said second electrode of said first actuable device at said first node and to said control electrode of said second actuable device, means for applying a precharge voltage at a first time period onto said first and second nodes causing said first and second charge-transfer actuable devices to turn on whereby said input signal electrodes charge up to predetermined values, said input signals to be detected from said first and second sources being applied to said first current carrying electrodes of said first and second charge-transfer actuable devices after said precharge voltage time period for relatively decreasing the signal on one of said first current carrying electrode and producing a relative increase of the signal on said control electrode of said one of said first and second charge-transfer actuable devices, and means for applying a ramp through said first and second capacitors to said second current carrying electrodes of said first and second charge-transfer actuable devices for causing said one of said first and second charge-transfer actuable devices to turn on relatively greater than the other and transfer relatively more charge from one of said first and second nodes to said input signal applying means wherein said relative amount of transferred charge is potentially greater in magnitude than charge obtained from said applied input signals thereby providing charge gain and voltage gain.

2. A preamplifier according to claim 1 further including third and fourth actuable devices each having first and second current carrying electrodes and a control electrode, said second electrode of said third actuable device being coupled to said control electrode of said second actuable device at said first node, said second electrode of said fourth actuable device being coupled to said control electrode of said first actuable device at said second node, said first capacitor being connected to said second electrode of said fourth actuable device at said second node, said second capacitor being connected to said second electrode of said third actuable device at said first node, a source of control signal of a given duration connected to said control electrodes of said third and fourth actuable devices for turning said third and fourth actuable devices on, thereby applying said precharge voltage onto said first and second nodes.

3. A preamplifier according to claim 2 further including fifth and sixth actuable devices each having first and second current carrying electrodes and a control electrode, said second electrode of said fifth actuable device being connected to said second electrode of said first charge-transfer actuable device at a third node, and said control electrode of said fifth actuable device being connected to said source of control signal, said second electrode of said sixth actuable device being connected to said second electrode of said second charge-transfer actuable device at a fourth node and said control electrode of said sixth actuable device being connected to said source of control signal, a third capacitor being connected between said first and third nodes, a fourth capacitor being connected between second and fourth nodes, said source of control signal of a given duration also functioning to turn said fifth and sixth actuable devices on and thereby applying a second precharge voltage onto said third and fourth nodes, said second precharge voltage being relatively much larger than said first precharge voltage by more than the threshold voltage of said actuable devices, and wherein said means for applying an increasing signal to said first and second capacitors causes said one of said first and second charge-transfer actuable devices to turn on relatively greater than the other and to transfer relatively more charge from one of said third and fourth nodes to said input signal applying means electrodes wherein said relative amount of transferred charge is potentially greater in magnitude than charge obtained from said applied input signal thereby providing charge gain and voltage gain.

4. A preamplifier according to claim 2 wherein said preamplifier is employed as a sense amplifier for memory arrays, and wherein said first and second sources of input signals are first and second memory cell array bit/sense lines connected to said first current carrying electrodes of said first and second actuable devices.

5. A preamplifier for memory arrays according to claim 4 comprising first and second charge-transfer actuable devices, each having first and second current carrying electrodes and a control electrode, said first electrodes of said first and second actuable devices being respectively coupled to first and second cells of said memory cell array via associated bit/sense lines, third and fourth actuable devices each having first and second current carrying electrodes and a control electrode, means for coupling said second electrodes of said first and third actuable devices to said control electrode of said second actuable device at a first node, means for coupling said second electrodes of said second and fourth actuable devices to said control electrode of said first actuable device at a second node, a first capacitor connected to said second electrodes of said second and fourth actuable devices at said second node and to said control electrode of said first actuable device, a second capacitor connected to said second electrode of said first and third actuable devices at first node and to said control electrode of said second actuable device, a source of control signal of a given duration connected to said control electrodes of said third and fourth actuable devices for turning said third and fourth actuable devices on, thereby applying a precharge voltage onto first and second nodes and causing said first and second charge-transfer actuable devices to turn on whereby said bit/sense lines charge up to predetermined values, wherein a single one of said input signals from said first and second memory cell sources is applied to said first current carrying electrode of only one of said first and second charge-transfer actuable devices for relatively increasing the signal on said control electrode of one of said first and second charge-transfer actuable devices, and a source of an increasing ramp signal connected to said first and second capacitors causing one of said first and second charge-transfer actuable devices to turn on relatively greater and transfer relatively greater charge from one of said first and second nodes to a corresponding one of said bit/sense lines wherein said relative transferred charge is potentially greater in magnitude than charge obtained from said memory cell being sensed thereby providing charge gain and voltage gain.

6. A preamplifier for memory arrays according to claim 5 further including fifth and sixth actuable devices each having first and second current carrying electrodes and a control electrode, said second electrode of said fifth actuable device being connected to said second electrode of said first charge-transfer actuable device at a third node, and said control electrode of said fifth actuable device being connected to said source of control signal, said second electrode of said sixth actuable device being connected to said second electrode of said second charge-transfer actuable device at a fourth node and said control electrode of said sixth actuable device being connected to said source of control signal, a third capacitor being connected between said first and third nodes, a fourth capacitor being connected between said second and fourth nodes, said source of control signal of a given duration also functioning to turn said fifth and sixth actuable devices on and thereby applying a second precharge voltage onto said third and fourth nodes, said second precharge voltage being relatively much larger than said first precharge voltage by more than the threshold voltage of said actuable devices, and wherein said means for applying an increasing signal to said first and second capacitors causes one of said first and second charge-transfer actuable devices to turn on relatively greater and transfer relatively greater charge from one of said third and fourth nodes to a corresponding one of said bit sense lines wherein said transferred charge is potentially greater in magnitude than charge obtained from said memory cell being sensed thereby providing charge gain and voltage gain.

7. A preamplifier according to claim 6 connected as a component of a sense amplifier including seventh and eighth and ninth and tenth actuable devices, each one of said devices having first and second current carrying electrodes and a control electrode, said second current carrying electrodes of said seventh and eighth devices being connected respectively to separate bit/sense lines and said control electrodes of said seventh and eighth devices being connected to a first signal source, said second current carrying electrodes of said ninth and tenth devices being respectively connected to said third and fourth nodes and said first current carrying electrodes of said ninth and tenth devices being connected to a second signal source.

said first signal source connected to said control electrodes of said seventh and eighth actuable devices providing signals for turning said seventh and eight devices on after said precharge voltage is applied on said third and fourth nodes for transferring charge to said bit/sense lines, said second signal source connected to said first current carrying electrodes of said ninth and tenth actuable devices providing signals for turning on one of said ninth and tenth devices and discharging one of said third and fourth nodes connected thereto and thereby turning on one of said first and second actuable devices connected to said one of said third and fourth nodes and thereby discharging one of said bit/sense lines connected to one of said first and second actuable devices.

8. A preamplifier according to claim 6 connected as component of a sense amplifier including seventh and eighth, ninth and tenth and eleventh and twelfth actuable devices, each one of said devices having first and second current carrying electrodes and a control electrode, said second current carrying electrodes of said seventh and eighth devices being connected respectively to separate bit/sense lines and said control electrodes of said seventh and eighth devices being connected to a first signal source, said control electrodes of said ninth and tenth devices being respectively connected to said fourth and third nodes, said second current carrying electrodes of said ninth and tenth devices being connected to said first current carrying electrodes of said eleventh and twelfth devices and said first current carrying electrodes of said ninth and tenth devices being connected to a second signal source, said second current carrying electrodes of said eleventh and twelfth devices being connected respectively to separate bit/sense lines and said control electrodes of said eleventh and twelfth devices being connected to a third signal source, said first signal source connected to said control electrodes of said seventh and eighth actuable devices and said third second signal source connected to said control electrodes of said eleventh and twelfth actuable devices providing signals for turning said devices on after said precharge voltage is applied on said third and fourth nodes for transferring charge to said bit/sense lines, said second signal source connected to said first current carrying electrodes of said ninth and tenth actuable devices providing signals for turning on one of said ninth and tenth devices and discharging one of said bit/sense lines.

9. A preamplifier according to claim 5 connected as a component of a sense amplifier including fifth and sixth and seventh and eighth actuable devices, each one of said devices having first and second current carrying electrodes and a control electrode, said second current carrying electrodes of said fifth and sixth devices being connected respectively to separate bit/sense lines and said control electrodes of said fifth and sixth devices being connected to a first signal source, said second current carrying electrodes of said seventh and eight devices being respectively connected to said first and second nodes, said first current carrying electrodes of said seventh and eighth devices being connected to a second signal source, said first signal source connected to said control electrodes of said fifth and sixth actuable devices providing signals for turning said fifth and sixth devices on after said precharge voltage is applied on said first and second nodes for transferring charge to said bit/sense lines, said second signal source connected to said first current carrying electrodes of said seventh and eighth actuable devices providing signals for turning on one of said seventh and eighth devices and discharging one of said first and second nodes connected thereto and thereby turning on one of said first and second actuable devices conected to said one of said first and second nodes and thereby discharging one of said bit/sense lines connected to one of said first and second actuable devices.

10. A preamplifier according to claim 5 connected as a component of a sense amplifier including fifth and sixth, seventh and eighth and ninth and tenth actuable devices, each one of said devices having first and second current carrying electrodes and a control electrode, said second current carrying electrodes of said fifth and sixth devices being connected respectively to separate bit/sense lines and said control electrodes of said fifth and sixth devices being connected to a first signal source, said control electrodes of said seventh and eighth devices being respectively connected to said first and second nodes, said second current carrying electrodes of said seventh and eighth devices being respectively connected to said first current carrying electrodes of said ninth and tenth actuable devices, and said first current carrying electrodes of said seventh and eighth devices being connected to a second signal source, said second current carrying electrodes of said ninth and tenth actuable devices being connected respectively to separate bit/sense lines, said control electrodes of said ninth and tenth devices being connected to a third signal source, said first signal source connected to said control electrodes of said fifth and sixth actuable devices and said third signal source connected to said control electrodes of said ninth and tenth actuable devices providing signals for turning said devices on after said precharge voltage is applied on said first and second nodes for transferring charge to said bit/sense lines, said second signal source connected to said first current carrying electrodes of said seventh and eighth actuable devices providing signals for turning on one of said seventh and eighth devices and discharging one of said bit/sense lines.

* * * * *